US007126421B2

(12) United States Patent
Gurvich et al.

(10) Patent No.: US 7,126,421 B2
(45) Date of Patent: Oct. 24, 2006

(54) METHOD FOR ALIGNING FEED FORWARD LOOPS

(75) Inventors: Mark Gurvich, Costa Mesa, CA (US); Nikolai Maslennikov, Huntington Beach, CA (US); Alexander Rabinovich, Cypress, CA (US); Bill Vassilakis, Tustin, CA (US)

(73) Assignee: Powerwave Technologies, Inc., Santa Ana, CA (US)

( * ) Notice: Subject to any disclaimer, the term of this patent is extended or adjusted under 35 U.S.C. 154(b) by 0 days.

(21) Appl. No.: 10/668,912

(22) Filed: Sep. 23, 2003

(65) Prior Publication Data

US 2005/0062532 A1    Mar. 24, 2005

(51) Int. Cl.
*H03F 1/00* (2006.01)
(52) U.S. Cl. .......................................... 330/151; 330/52
(58) Field of Classification Search ..................... None
See application file for complete search history.

(56) References Cited

U.S. PATENT DOCUMENTS

| 4,694,258 | A |   | 9/1987  | Blumenkranz et al. ..... 330/149 |
|-----------|---|---|---------|----------------------------------|
| 5,394,120 | A |   | 2/1995  | Sakamoto et al. ............. 330/2 |
| 5,610,554 | A | * | 3/1997  | Anvari ........................ 330/52 |
| 5,774,018 | A | * | 6/1998  | Gianfortune et al. .......... 330/52 |
| 5,831,478 | A | * | 11/1998 | Long ............................. 330/52 |
| 5,949,283 | A |   | 9/1999  | Proctor et al. ............... 375/296 |
| 5,955,916 | A |   | 9/1999  | Hunton ........................... 333/2 |
| 6,108,385 | A |   | 8/2000  | Worley, III ..................... 330/2 |
| 6,236,286 | B1 |  | 5/2001  | Hoffmann et al. ........... 110/347 |
| 6,255,903 | B1 | * | 7/2001  | Leffel .......................... 330/151 |
| 6,275,106 | B1 | * | 8/2001  | Gomez ........................ 330/151 |
| 6,359,509 | B1 |  | 3/2002  | Guthrie ....................... 330/151 |
| 6,384,681 | B1 |  | 5/2002  | Bonds ......................... 330/149 |
| 6,392,482 | B1 |  | 5/2002  | Dartois ........................ 330/151 |
| 6,407,635 | B1 |  | 6/2002  | Mucenieks et al. ......... 330/149 |
| 6,424,215 | B1 | * | 7/2002  | Rice ............................. 330/151 |
| 6,496,064 | B1 |  | 12/2002 | Rzyski ......................... 330/149 |
| 6,516,185 | B1 |  | 2/2003  | MacNally ................ 455/234.1 |
| 6,710,652 | B1 | * | 3/2004  | Miyaji et al. ................ 330/151 |
| 6,794,933 | B1 | * | 9/2004  | Gurvich et al. ................ 330/52 |
| 2002/0127979 | A1 | | 9/2002 | Pekkarinen et al. ......... 330/151 |
| 2003/0011427 | A1 | | 1/2003 | Cavers et al. ................ 330/149 |
| 2003/0016081 | A1 | | 1/2003 | Ishida et al. .................. 330/52 |
| 2003/0042979 | A1 | | 3/2003 | Gurvich et al. .............. 330/151 |

* cited by examiner

*Primary Examiner*—Khanh Van Nguyen
(74) *Attorney, Agent, or Firm*—Myers Dawes Andras & Sherman, LLP.

(57) ABSTRACT

A method for aligning a feed forward radio frequency power amplifier includes applying a radio frequency signal to the feed forward radio frequency power amplifier and monitoring a radio frequency signal from the feed forward radio frequency power amplifier, without opening a break point of the feed forward radio frequency amplifier.

12 Claims, 6 Drawing Sheets

METHOD FOR ALIGNING FEED FORWARD LOOPS

BACKGROUND

1. Field of the Invention

The present invention relates generally to amplifiers. The present invention relates more particularly to feed forward amplifiers and methods for aligning feed forward amplifiers.

2. Description of the Prior Art and Related Information

Radio frequency power amplifiers are commonly used in various applications. Examples of such applications include broadcasting, satellite communications, and cellular communications. Radio frequency power amplifiers increase the power of a radio frequency signal so that it is suitable for transmission through the air.

Generally, it is desirable to constrain transmitted radio frequencies utilized in such applications to a desired bandwidth. However, radio frequency power amplifiers inherently distort transmitted signals in a manner that causes them to extend beyond the desired bandwidth. That is, amplifier non-linearities and other factors tend to add components to a transmitted radio signal. These components often have frequencies other than the intended carrier frequency and thus may extend beyond the desired bandwidth.

Such undesirable frequency components waste energy, interfere with other radio signals and may violate Federal Communications Commission (FCC) rules.

Feed forward radio frequency power amplifiers utilize feed forward loops to mitigate such undesirable frequency components and thereby attempt to maintain the entire transmitted radio frequency signal within the desired bandwidth. The undesirable frequency components are mitigated by forming an error signal which tends to cancel them from the amplified signal when the error signal is combined with the amplified signal.

In order for such cancellation to be effective, the feed forward loops must be accurately aligned. According to contemporary practice, alignment of the feed forward loops requires that a feed forward radio frequency power amplifier have at least one breakpoint. Breakpoints prevent radio frequency signals from one part of a feed forward circuit from interfering with the testing of another part of the feed forward circuit.

However, there are several inherent disadvantages associated with the use of breakpoints in feed forward radio frequency power amplifiers. For example, breakpoints tend to introduce undesirable losses into a radio frequency circuit, add undesirably to the cost of the radio frequency power amplifier, and inhibit full automation of feed forward loop alignment.

As those skilled in the art will appreciate, the use of a breakpoint in a radio frequency circuit introduces inherent losses associated with the resistance, capacitance and inductance of the connectors and other components thereof. Indeed, such connectors are also subject to malfunction and thus affect the reliability of the radio frequency power amplifier.

Of course, the addition of such components of the breakpoints as connectors and cables increases the cost of manufacturing the radio frequency power amplifier. This is due not only to the increased cost reflected in the bill of materials, but is also due to such factors as increased assembly costs and reduce yield.

Full automation of a radio frequency power amplifier is inhibited because such breakpoints must be manually opened and closed by a human attendant. The use of automatic equipment to open and close breakpoints is difficult, unreliable and expensive.

As such, although the prior art has recognized, to a limited extent, the problem of aligning feed forward radio frequency power amplifiers, the proposed solutions have, to date, been ineffective in providing a satisfactory remedy. Moreover, although such contemporary feed forward radio frequency power amplifiers have proven generally suitable for their intended purposes, they possess inherent deficiencies which detract from their overall effectiveness and desirability. Therefore, it is desirable to provide a feed forward radio frequency power amplifier which does not have breakpoints and which can be aligned via a fully automated process.

BRIEF SUMMARY OF THE INVENTION

The present invention specifically addresses and alleviates the above mentioned deficiencies associated with the prior art. More particularly, according to one aspect the present invention comprises a method for aligning a feed forward radio frequency power amplifier, wherein the method comprises applying a radio frequency signal to the feed forward radio frequency power amplifier and monitoring a radio frequency signal from the feed forward radio frequency power amplifier, without opening a break point of the feed forward radio frequency amplifier.

According to another aspect, the present invention comprises a method for automatically aligning a feed forward loop in a radio frequency power amplifier, wherein the method comprises applying a radio frequency signal to an input of the radio frequency power amplifier, splitting the radio frequency signal, communicating the radio frequency signal through both legs of one loop of the radio frequency power amplifier, combining radio frequency signals from both legs of the loop, and monitoring the combined radio frequency signal from a selected point of the radio frequency power amplifier.

Preferably, the radio frequency signal is split such that it is communicated along a passive path (comprising one leg of a loop) and an active path (comprising the other leg of the loop). The passive path preferably contains only a delay device, such as a loop delay and/or a group delay filter. The active path contains at least one amplifier, such as the main amplifier or the error amplifier.

Preferably, complex gain $(S21)^p$ is measure along the passive path with the gain of the active path minimized (such as by maximizing attenuation along the active path and such as by inhibiting the application of operating voltages to active devices, e.g. amplifiers, of the active path). Preferably, complex gain $(S21)^c$ is also measured along the composite (passive plus active) path (such as by minimizing attenuation along the active path and such as by facilitating the application of operating voltages to actives devices, e.g. amplifiers, of the active path). Varying (maximizing and minimizing) attenuation and inhibiting/facilitating operating voltages is preferably performed by an external controller, as discussed below.

Preferably, the relative complex gain $(S21)^e$ is calculated from the complex gain $(S21)^p$ and the complex gain $(S21)^c$ as described in detail below and the relative complex gain $(S21)^e$ is used to facilitate alignment of the loop by adjusting the amplitude adjuster, phase adjuster, and/or group delay thereof.

In order to facilitate alignment of the signal cancellation-loop, communication of a radio frequency signal from a signal cancellation loop delay to an error cancellation loop group delay adjuster is facilitated and the selected point of the radio frequency power amplifier provides a signal representative of an output of the error cancellation loop group delay adjuster. Communication of the radio frequency signal from the signal cancellation loop delay to the error cancellation loop group delay adjuster is preferably facilitated by closing a switch.

The output of the radio frequency power amplifier is preferably terminated so as to mitigate unwanted reflections therefrom which may interfere with the alignment process.

In order to facilitate alignment of the error cancellation loop, communication of a radio frequency signal from a signal cancellation loop delay to an error cancellation loop group delay adjuster is inhibited and the selected point is an output of the radio frequency power amplifier. Communication of the radio frequency signal from the signal cancellation loop delay to the error cancellation loop group delay adjuster is preferably inhibited by opening a switch.

According to another aspect of the present invention, a swept frequency signal is applied to the input of the radio frequency power amplifier. The swept frequency signal is preferably applied to the input of the radio frequency power amplifier from a network analyzer. The swept frequency signal preferably covers the bandwidth of the main amplifier.

According to another aspect of the present invention, a controller selects the point from which the radio frequency signal of the power amplifier is monitored. The controller may comprise a piece of automatic test equipment or a personal computer. Preferably, the controller controls the state of a switch which facilitates and inhibits communication of a radio frequency signal from the signal cancellation loop delay to the error cancellation loop group delay adjuster. Preferably, the controller controls the application of the radio frequency signal to the input of the radio frequency power amplifier.

According to another aspect, the present invention comprises a system for aligning a feed forward radio frequency power amplifier, wherein the system comprises a signal source configured to provide a radio frequency signal to the feed forward radio frequency power amplifier and a signal monitor configured to monitor a radio frequency signal from the feed forward radio frequency power amplifier, wherein the signal source and the signal monitor are configured to cooperate with the feed forward radio frequency power amplifier in a manner which facilitates alignment of at least one loop thereof without opening a break point of the feed forward radio frequency power amplifier.

According to another aspect, the present invention comprises a system for automatically aligning a feed forward loop in a radio frequency power amplifier, the system comprising a radio frequency source configured to provide a radio frequency signal to the radio frequency power amplifier, a radio frequency monitor configured to monitor a radio frequency signal from the radio frequency power amplifier, a switch for determining what point on the radio frequency power amplifier the radio frequency monitor is in communication with, and a controller configured to control an output of the radio frequency source and to control a position of the switch. Preferably, the radio frequency source and the radio frequency monitor at least partially define a network analyzer.

According to another aspect, the present invention comprises a feed forward radio frequency power amplifier which comprises a signal cancellation loop and an error cancellation loop. The signal cancellation loop and/or the error cancellation loop are configured so as to facilitate alignment thereof without the use of a breakpoint.

According to another aspect, the present invention comprises a radio frequency power amplifier which comprises a signal cancellation loop comprising a delay, and the radio frequency power amplifier also comprises an error cancellation loop. The signal cancellation loop further comprises a switch having a closed position in which a radio frequency signal is communicated from the delay of the signal cancellation loop to the error cancellation loop. A non-switchable conductive conduit is preferably configured to communicate a radio frequency signal from a main amplifier of the signal cancellation loop to a group delay filter of the error cancellation loop.

These, as well as other advantages of the present invention, will be more apparent from the following description and drawings. It is understood that changes in the specific structure shown and described may be made within the scope of the claims, without departing from the spirit of the invention.

BRIEF DESCRIPTION OF THE DRAWINGS

The present invention and its various embodiments can now be better understood by turning to the following detailed description of the preferred embodiments which are presented as illustrated examples of the invention defined in the claims. It is expressly understood that the invention as defined by the claims may be broader than the illustrated embodiments described below.

DETAILED DESCRIPTION OF THE PREFERRED EMBODIMENTS

Figure 1:
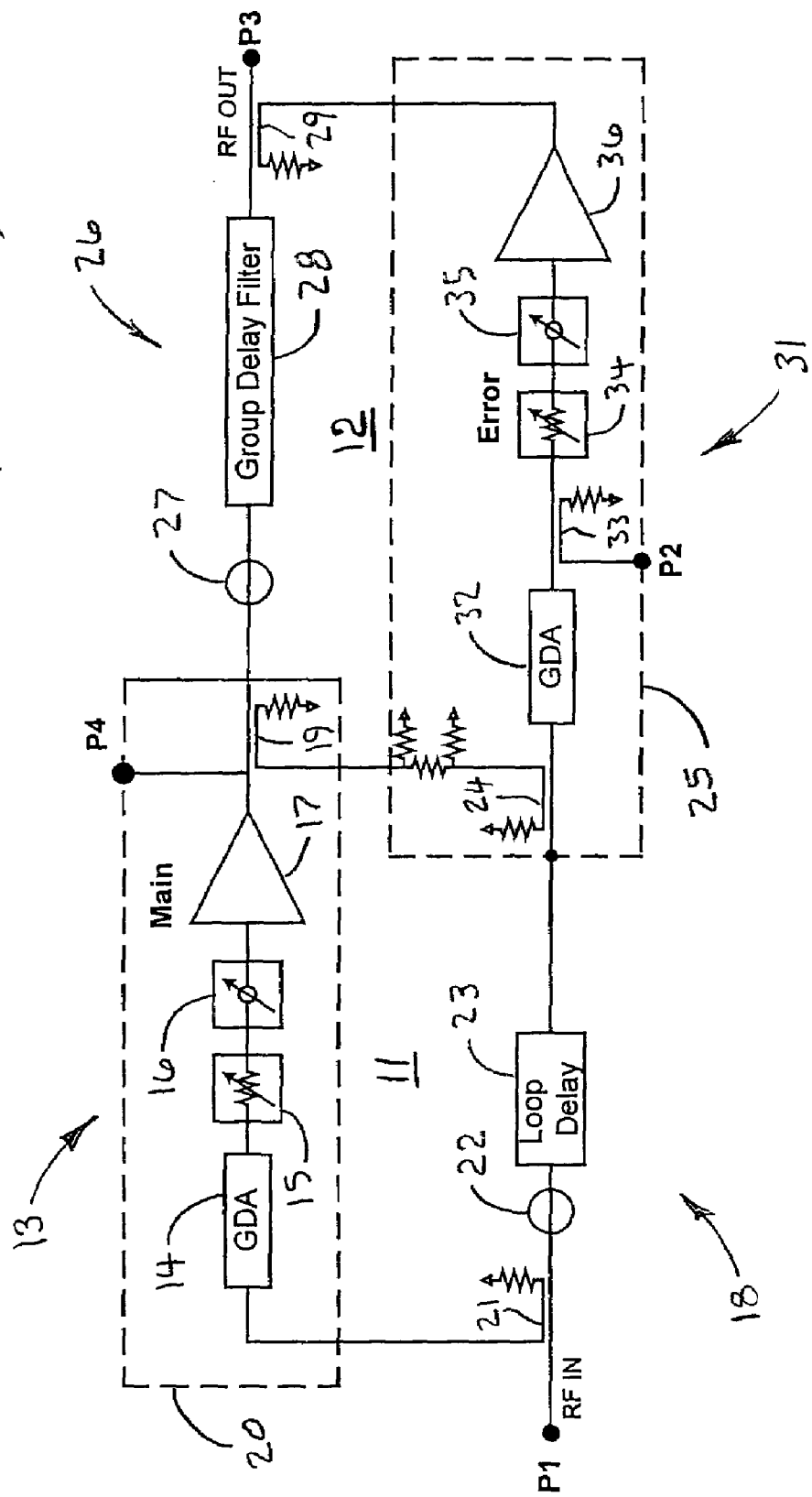
FIG. 1 is a block diagram of a contemporary feed forward radio frequency power amplifier showing a breakpoint in the signal cancellation loop thereof and a breakpoint in the error cancellation loop thereof.
Figure 2:
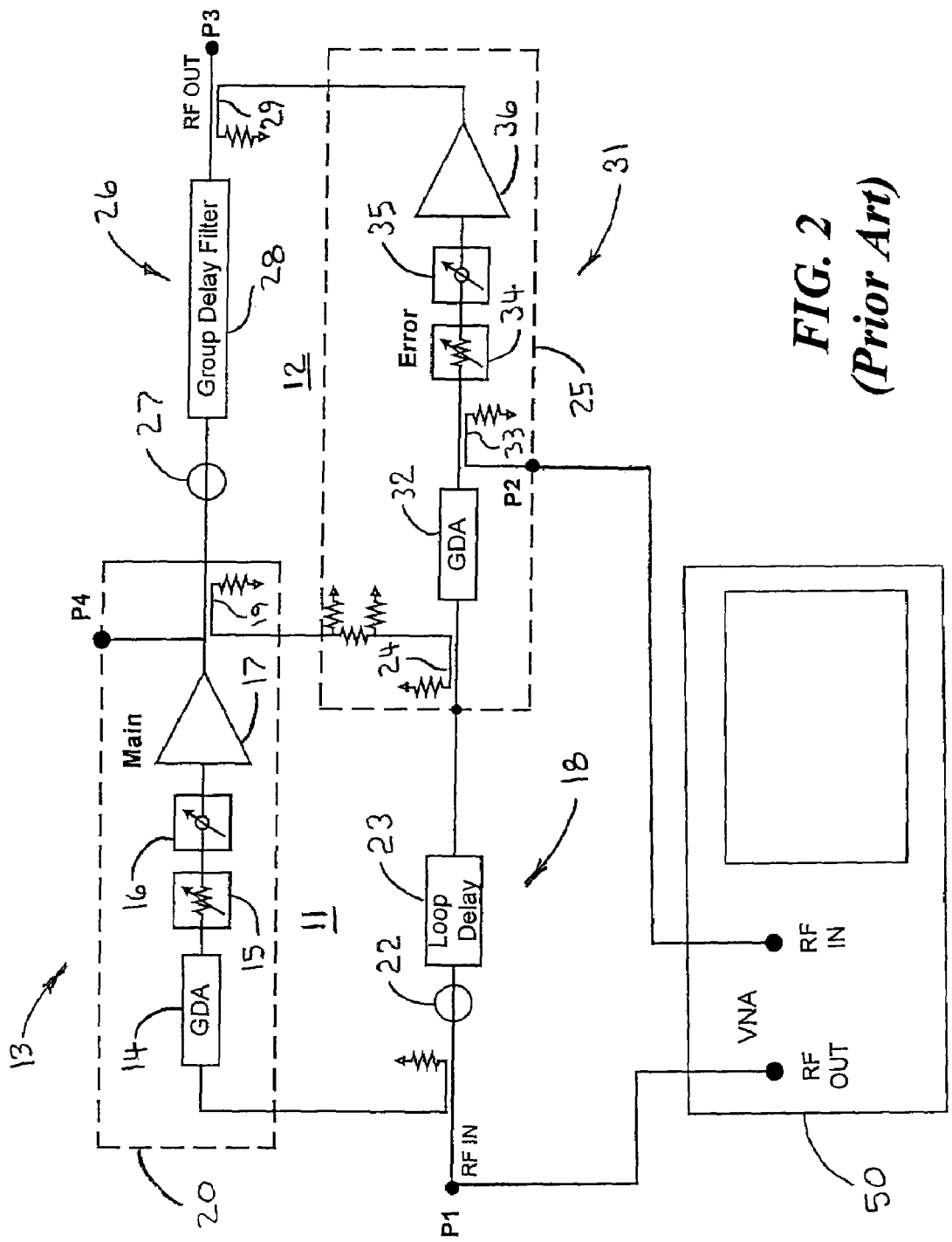
FIG. 2 is a block diagram of an alignment setup for the signal cancellation loop of the feed forward radio frequency power amplifier according to contemporary practice.
Figure 3:
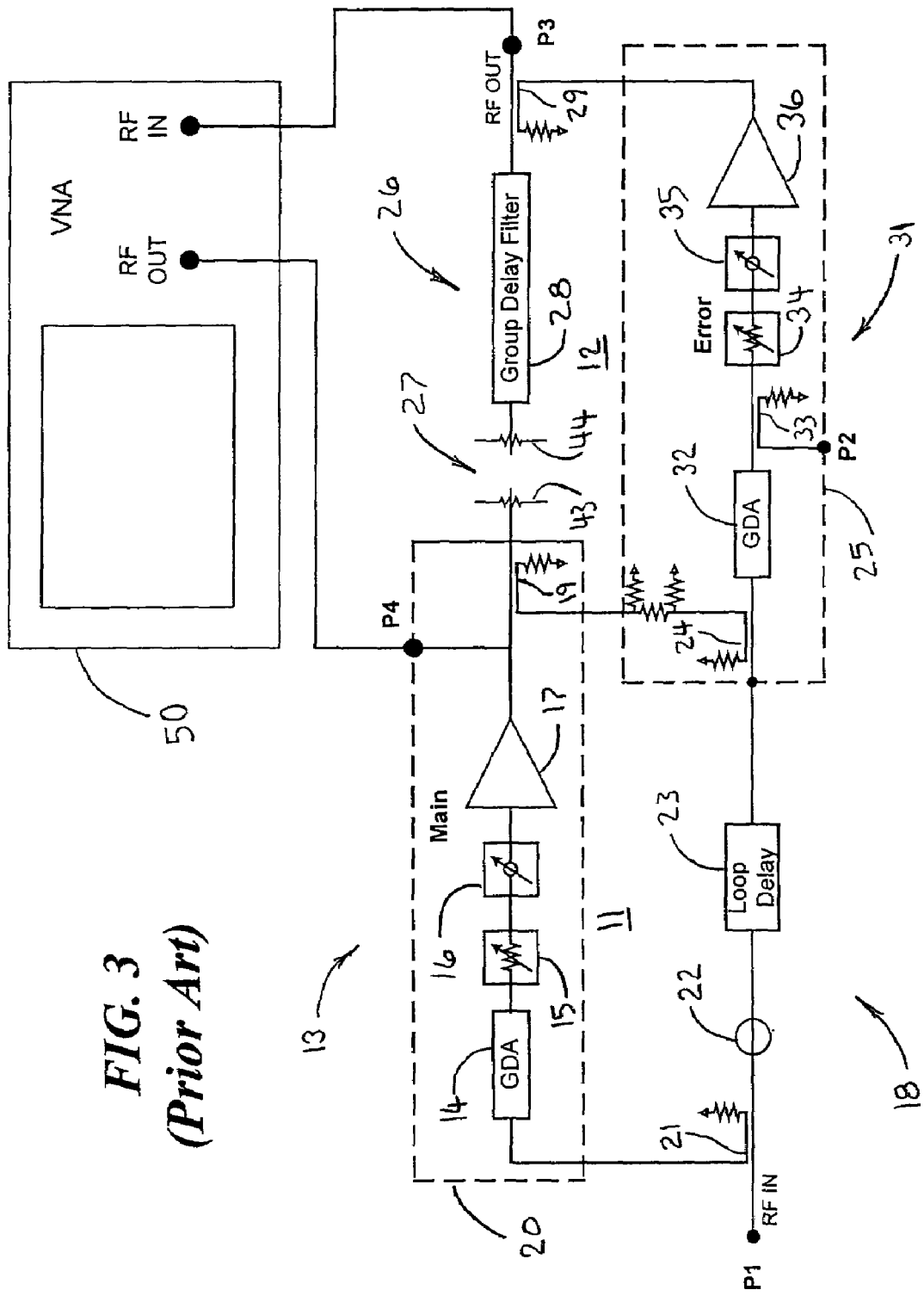
FIG. 3 is a block diagram of an alignment setup for the error cancellation loop of the feed forward radio frequency power amplifier according to contemporary practice.

FIGS. 1–3 depict a contemporary feed forward radio frequency power amplifier and test setups for adjusting the alignment thereof. With particular reference to FIG. 1, a contemporary feed forward radio frequency power amplifier comprises a signal cancellation loop 11 and an error cancellation loop 12 which operate according to well know principles to mitigate undesirable frequency components or errors in the output of the radio frequency power amplifier.

More particularly, the signal or carrier cancellation loop 11 attempts to cancel the radio frequency signal from a sampled composite (desired amplified radio frequency carrier signal plus error) signal such that the remaining error signal can subsequently be used to attempt to cancel the error signal from the output of the radio frequency power amplifier.

The signal cancellation loop has two legs. An upper leg 13 comprises a group delay adjuster 14, an amplitude adjuster 15, a phase adjuster 16, and a main amplifier 17. The group delay adjuster 14, amplitude adjuster 15, and a phase adjuster 16 cooperate to provide a desired amplitude and phase of the radio frequency signal provided to main amplifier 17.

The upper leg 13 also comprises a test point P4 and a sampling coupler 19. The test point P4 facilitates alignment of the error cancellation loop 12 as shown in FIG. 3 and discussed in detail below. The sampling coupler 19 provides a sample of the composite signal output from the main amplifier 17.

The lower leg 18 comprises an input sampling coupler 21, an error cancellation loop break point 22, a loop delay 23 and a summing coupler 24. The input sampling coupler 21 provides a sample of the radio frequency input from P1 to the upper leg 13 of the signal cancellation loop. The break point 22 is a switch which, when closed, provides the radio frequency input signal from P1 to the loop delay 23 and which, when open, facilitates alignment of the signal cancellation loop 11, as shown in FIG. 2 and discussed below. The loop delay 23 delays the input radio frequency signal so that it will nominally be 180 degrees out of phase with the sampled composite signal from the upper leg 13. The summing coupler 24 adds the sampled (and attenuated) output of the main amplifier 17 to the delayed radio frequency input signal (which is therefore nominally 180 degrees out of phase therewith), such that the desired signal is effectively cancelled from the composite signal, and substantially only the error signal remains and is communicated to the error cancellation loop 12.

The error cancellation loop 12 attempts to cancel the error signal from the amplified composite signal from the main amplifier 17, such that only the desired signal is available for output from the radio frequency power amplifier at output P3.

Like the signal cancellation loop 11, the error cancellation loop 12 has two legs. The upper leg 26 comprises an error cancellation loop break point 27, a group delay filter 28 and an error signal injection coupler 29. The break point 27 must be a manually operated connection since terminations are necessary to prevent reflections. This connection, when closed, provides the radio frequency output from the main amplifier 17 to the group delay filter 28 and which, when open, facilitates alignment of the error cancellation loop as shown in FIG. 3 and discussed below. The group delay filter delays the radio frequency composite signal from the main amplifier 17 in a manner which allows the main amplifier's output and the error signal from the lower leg 31 of the error cancellation loop 12 (which is 180 degrees out of phase with respect to the main amplifier's output) to combine via the error signal injection coupler 29 such that the error signal is substantially cancelled from the main amplifier's output.

The lower leg 31 of the error cancellation loop 12 comprises a group delay adjuster 32, an amplitude adjuster 34, a phase adjuster 35 and an error amplifier 36. The group delay adjuster 32, amplitude adjuster 34, and phase adjuster 35 operate in a manner analogous to the corresponding components of the signal cancellation loop 11 to provide a desired amplitude and phase of the error signal to the error amplifier 36.

The lower leg 31 also comprises a test sample coupler 33 which provides a sampled error signal to test point P2, so as to facilitate alignment of the signal cancellation loop as shown in FIG. 2 and discussed below.

In order to achieve proper cancellation in the signal cancellation loop 11 and in the error cancellation loop 12, in is necessary that these loops be aligned is such a way that the gain and phase characteristics of one leg of a loop match the gain and phase characteristics of the other leg of the same loop, according to well known principles. Ideally, such matching must occur over the full frequency bandwidth of the main amplifier 17.

More particularly, in order for proper cancellation to take place, the two signals being combined by the cancellation coupler 24 must be substantially matched with respect to amplitude, phase (should be 180° out of phase), and delay. Similarly, the two signals being combined by the error signal injection coupler 29 must be substantially matched with respect to amplitude, phase (should be 180° out of phase), and delay.

The upper leg 13 of the signal cancellation loop 11 may be formed as one module 20 and the lower leg 31 of the error cancellation loop 12 may be formed as another module 25, if desired. Each module is preferably formed upon a separate substrate and the modules and other components are electrically interconnected via cables and/or buses.

With particular reference to FIG. 2, alignment of the signal cancellation loop is performed according to contemporary practice by connecting the signal source (RF OUT) of a vector network analyzer 50 to the radio frequency input P1 of the radio frequency power amplifier and connecting the signal monitor (RF IN) of the vector network analyzer 50 to the test point P2 of the radio frequency power amplifier. Break point 22 is opened and break point 27 is manually closed (typically using cables) during alignment of the signal cancellation loop 11.

A swept radio frequency output is proved by the vector network analyzer 50 to the upper leg 13 of the signal cancellation loop 11, so as to characterize the effects of the group delay adjuster 14, amplitude adjuster 15, phase adjuster 16, and main amplifier 17 upon signals of various frequencies which are transmitted therethrough. Such characterization facilitates alignment of the signal cancellation loop according to well known principles.

With particular reference to FIG. 3, alignment of the error cancellation loop 12 is performed in a similar manner according to contemporary practice. The signal source (RF OUT) of the vector network analyzer 50 is connected to test point P4 of the radio frequency power amplifier and the signal monitor (RF IN) of the vector network analyzer 50 is connected to the radio frequency output P3 of the radio frequency power amplifier. Break point 27 is manually opened and terminations 43 and 44 are provided to inhibit reflections that may otherwise interfere with the alignment procedure. Break point 22 is closed during the alignment of the error cancellation loop 12.

A swept radio frequency output is proved by the vector network analyzer 50 to the lower leg 31 of the error cancellation loop 12, so as to characterize the effects of the group delay adjuster 32, amplitude adjuster 34, phase adjuster 35, and error amplifier 36 upon signals of various frequencies which are transmitter therethrough. Such characterization facilitates alignment of the error cancellation loop according to well know principles.

Figure 4:
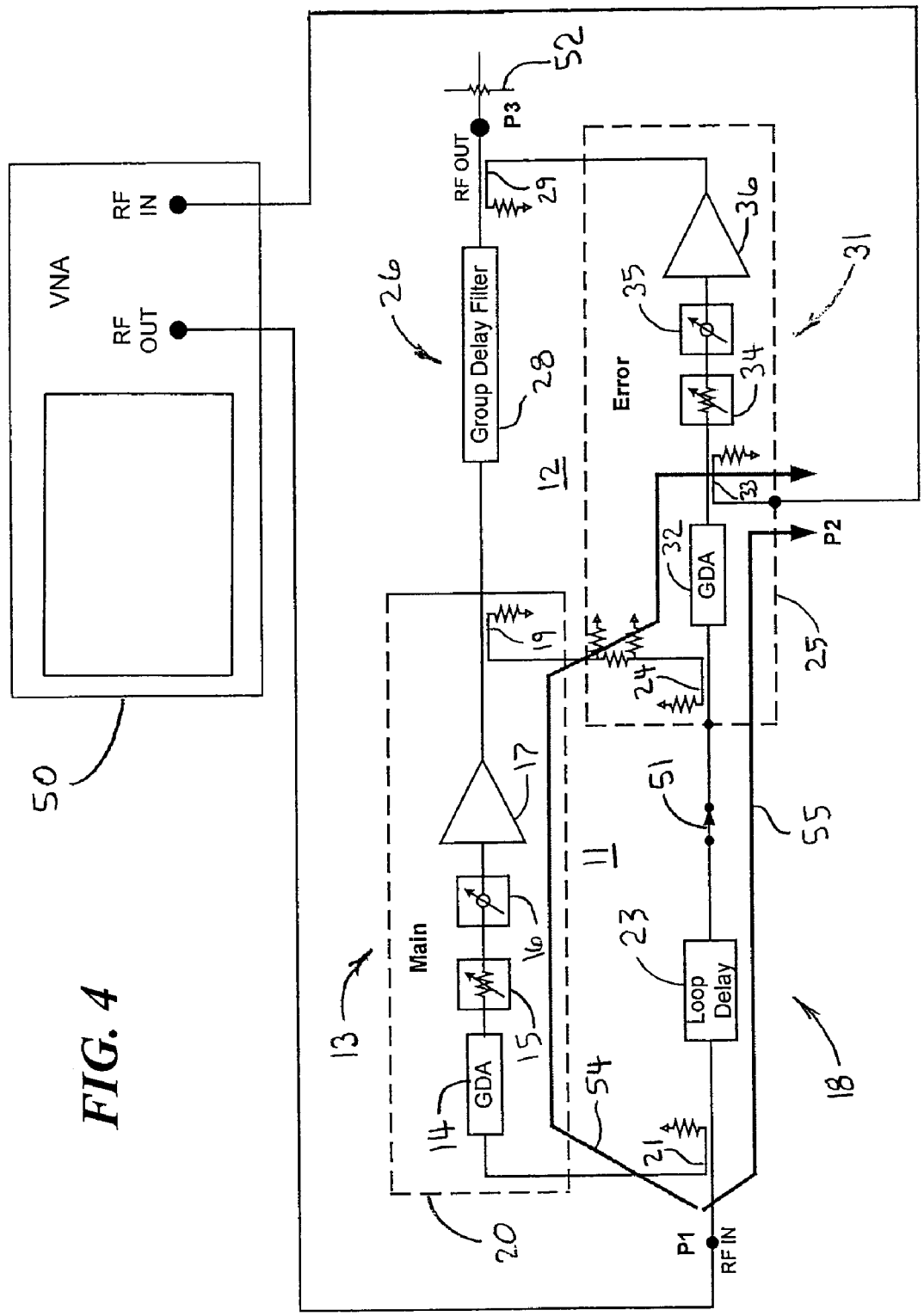
FIG. 4 is a block diagram of an alignment setup for the signal cancellation loop of a feed forward radio frequency power amplifier according to the present invention.
Figure 5:
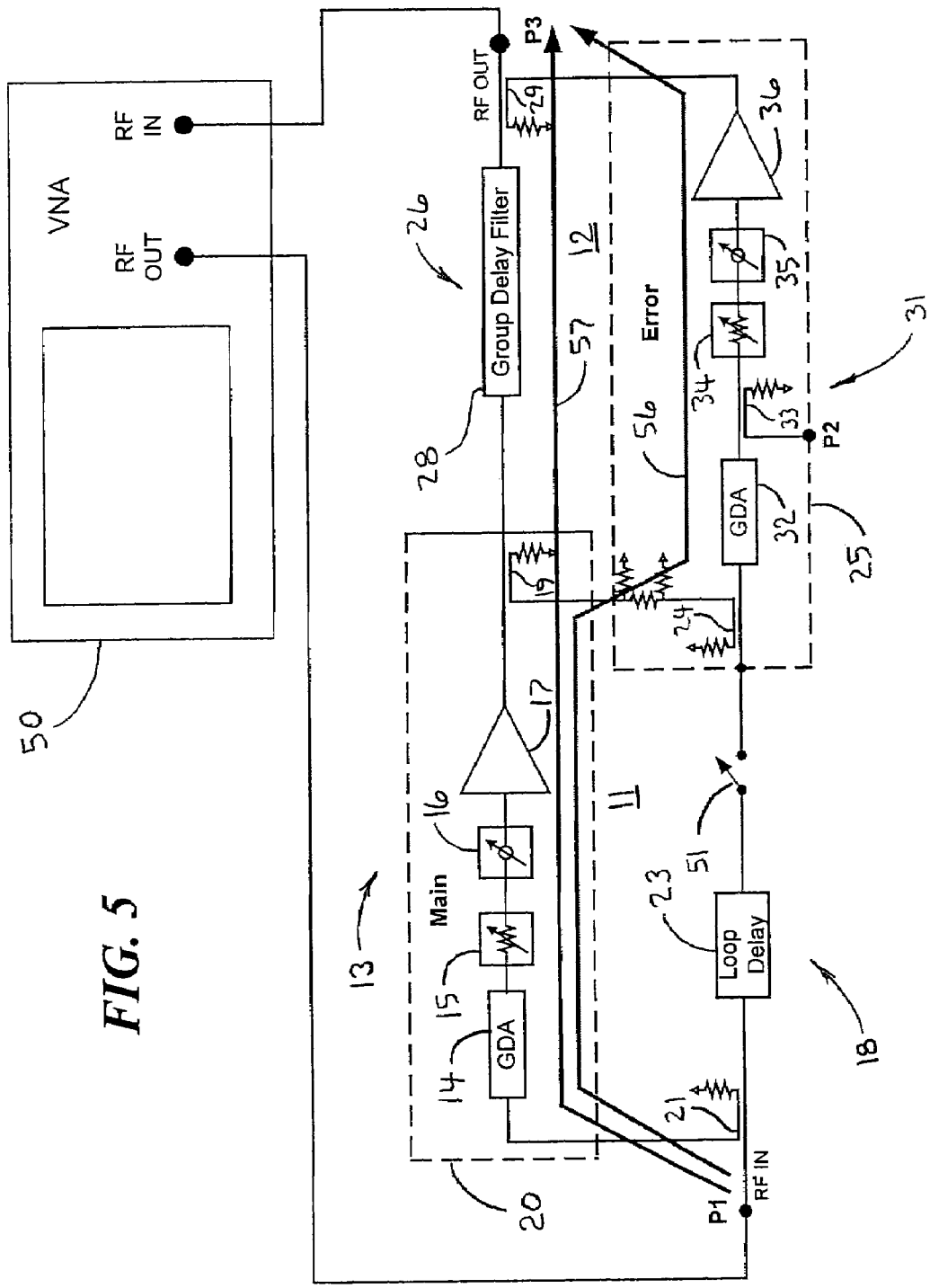
FIG. 5 is a block diagram of an alignment setup for the error cancellation loop of a feed forward radio frequency power amplifier according to the present invention.

Referring now to FIGS. 4 and 5, the present invention comprises a radio frequency power amplifier and a method for testing and/or aligning the same. The radio frequency power amplifier of the present invention does not have any break points. Alignment is performed by applying a swept radio frequency signal to the radio frequency input P1 of the power amplifier and then monitoring the radio frequency signal at a selected point (P2 or P3).

According to the present invention, the applied swept radio frequency signal is split into two components. One component is communicated along the upper leg of the loop being tested and the other component is communicated along the lower leg of the loop being tested. In each loop, one component travels along a passive path that merely includes a delay and the other component travels along an active path that includes a group delay adjuster, an amplitude adjuster, a phase adjuster and an amplifier. Typically, it is the group delay adjuster, the amplitude adjuster and the phase adjuster of the active path that are adjusted during the alignment process. However, it some instances it may also be desirable to adjust the delay of the passive path and/or the amplifier of the active path.

Preferably, measurements of the complex gain for the passive path alone and for the combined passive path and the active path are performed and a calculated relative complex gain is used to align the loops, as discussed in detail below.

With particular reference to FIG. 4, according to the present invention the signal cancellation loop 11 is aligned by connecting the signal source (RF OUT) of a vector network analyzer 50 to the radio frequency input P1 of the radio frequency power amplifier and connecting the signal monitor (RF IN) of the vector network analyzer 50 to test point P2 of the radio frequency power amplifier.

Since switch 51 remains closed during alignment of the signal cancellation loop 11, the input radio frequency signal from the vector network analyzer is split by the input sampling coupler 21 and is communicated along both active path 54 and passive path 55. The active path 54 comprises the upper leg 13 of the signal cancellation loop 11 and the passive path 55 comprises the lower leg 18 of the signal cancellation loop 11. The group delay adjuster 14, the amplitude adjuster 15, the phase adjuster 16 and the main amplifier 17 of the upper leg 13 vary the amplitude and phase of the signal which was communicated through the upper leg 13, generally in a frequency dependent manner, with respect to the signal which was communicated through the lower leg 18 (and which was subject to delay caused by the loop delay 23).

The signals from the upper leg 13 and the lower leg 18 are combined by the summing coupler 24 and the combined signal is monitored by the vector network analyzer 50 at test point P2.

When alignment of the signal cancellation loop 11 is proper and the composite (passive plus active) signal is being monitored, the vector network analyzer 50 indicates that a substantial portion of the signal provided by the vector network analyzer 50 is absent from the signal monitored thereby and the signal monitored thereby contains substantially only the error components introduced by the main amplifier 17. That is, the signal cancellation loop 11 has functioned in its normal capacity to remove the carrier signal from the composite signal and leave only the error signal.

Adjustment of the alignment of the signal cancellation loop 11 is preferably effected by performing measurement of both a passive path (comprising a loop delay or group delay filter and not comprising any active components such as an amplifier) and a composite path (comprising a loop delay or group delay filter and also comprising an amplifier) for each loop, as discussed in detail below.

During testing of the signal cancellation loop 13, the radio frequency output P3 is terminated with termination 52 to mitigate undesirable reflections.

With particular reference to FIG. 5, according to the present invention alignment of the error cancellation loop 12 is performed in a similar manner. More particularly, the error cancellation loop 12 is aligned by connecting the signal source (RF OUT) of a vector network analyzer 50 to the radio frequency input P1 of the radio frequency power amplifier and connecting the signal monitor (RF IN) of the vector network analyzer 50 to radio frequency output P3 of the radio frequency power amplifier. Switch 51 is open for alignment of the error cancellation loop 12. When switch 51 is open, the connection between respective terminals is broken and each terminal is preferably terminated with a 50 ohm load to avoid undesirable reflections in the system. Switches with built in 50 ohm terminations are commercially available and may be automatically controlled allowing automated processing as discussed below.

Since switch 51 is open and no break points are used in the error loop 12, the input radio frequency signal from the vector network analyzer is split by the distortion sampling coupler 19 and is communicated along both active path 56 and passive path 57. The active path 56 comprises the lower leg 31 of the error cancellation loop 12 and the passive path 57 comprises the upper leg 26 of the error cancellation loop 12. The group delay adjuster 32, the amplitude adjuster 34, the phase adjuster 35 and the error amplifier 36 of the lower leg 31 vary the amplitude and phase of the signal which was communicated through the lower leg 31, generally in a frequency dependent manner, with respect to the signal which was communicated through the upper leg 26 (and which was subject to delay caused by the group delay filter 28).

The signals from the upper leg 26 and the lower leg 31 are combined by the error signal injection coupler 29 and the combined signal is monitored by the vector network analyzer 50 at radio frequency output P3.

Unlike alignment of the signal cancellation loop 11, alignment of the error cancellation loop does not involve operation thereof in its normal capacity. This is because switch 51 is open, thus preventing the signal cancellation loop 11 from operating in its normal capacity so as to provide a carrier cancelled error signal. That is, rather than an error signal alone, the error cancellation loop now receives a sample of the composite signal from the signal cancellation loop 11 via the summing coupler 24. This signal may be used for loop alignment. In particular, a preferred alignment technique is described below in relation to FIG. 6.

Figure 6:
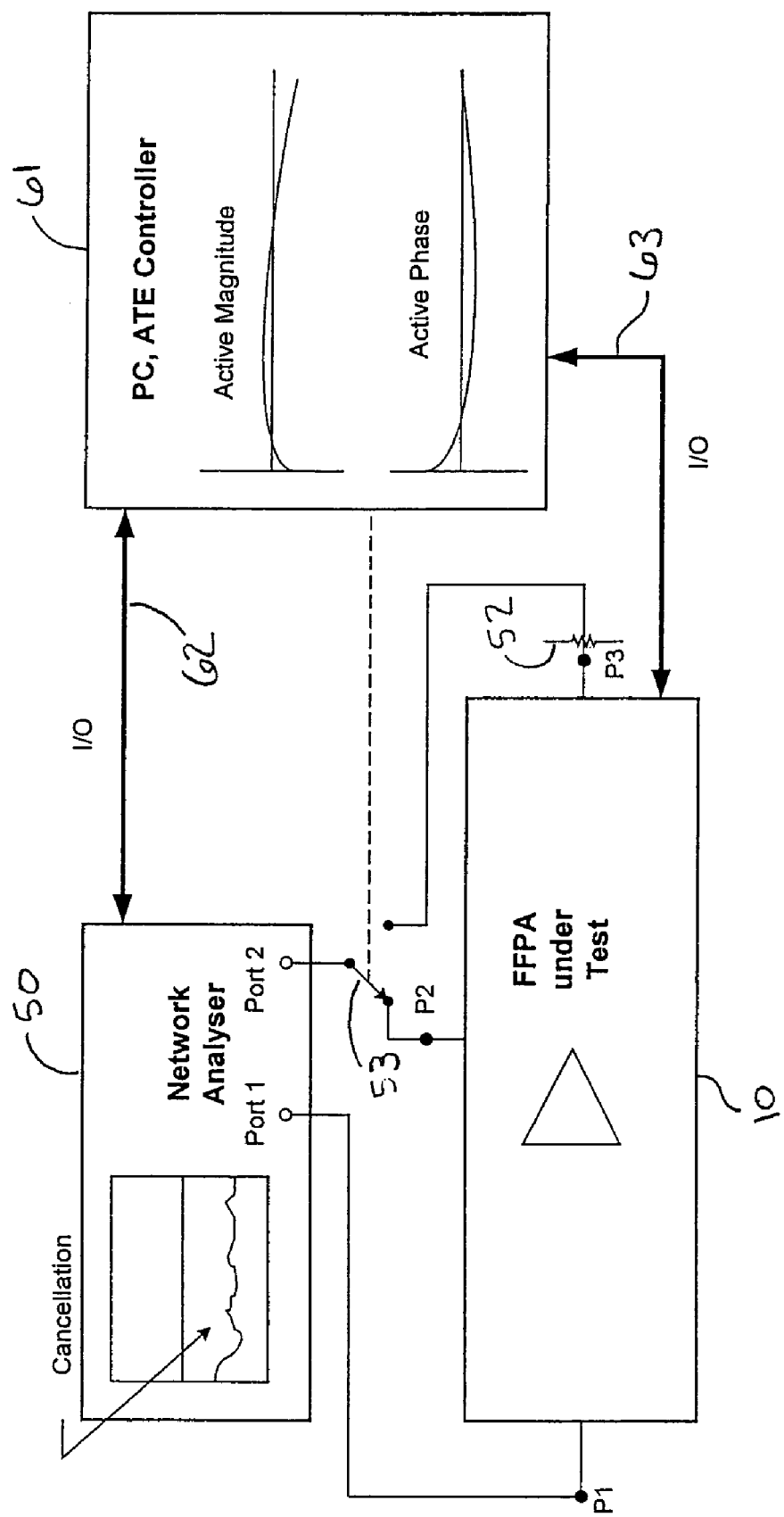
FIG. 6 is a block diagram of a test setup for automatically testing both the signal cancellation loop and the error cancellation loop according to the present invention.

Referring now to FIG. 6, the controller 61 interfaces with the vector network analyzer 50 via I/O 62 and interfaces with the radio frequency power amplifier 10 via I/O 63. Switch 53 is controlled by the controller so as to effect monitoring of the desired test point (P2 or P3) by the vector network analyzer 50. Termination 52 prevents undesirable reflections from the radio frequency output at P3 during testing of the signal cancellation loop, as discussed above.

The controller 61 is preferably controlled by software. However, as those skilled in the art will appreciate, the controller 61 may also be controlled by firmware. Indeed, the controller 61 may be controlled by dedicated hardware logic.

Referring to FIG. 6 (and to FIGS. 4–5), an automated alignment method will be described. Automated alignment of both the signal cancellation loop 11 and the error cancellation loop 12 is preferably performed according to the following procedure. First, the gain of the active path (path 54 when aligning the signal cancellation loop and path 56 when aligning the error cancellation loop 12) is mitigated by maximizing loop attenuation (such as via amplitude adjuster 15 for the signal cancellation loop 11 or amplitude adjuster 34 for the error cancellation path 12) and by shutting off voltages from the active devices (such as main amplifier 17 for the signal cancellation loop 11 or error amplifier 36 for the error cancellation loop 12).

The passive path complex gain $(s21)^p$ is measured across the frequency range and is stored in memory (such as the memory of a personal computer or controller 61).

The active path is fully enabled (attenuation is minimized and operating voltages are provided to the active devices) and the complex gain $(S21)^c$ for the composite path (both the active path and the passive path operating in parallel) is measured and stored in the memory.

The relative complex gain $(S21)^e$ is calculated at all frequencies using the formula: $(S21)^e=1-(S21)^c/(S21)^p$. The phase and the magnitude of the relative complex gain $(S21)^e$ is then optionally displayed, preferably in a user friendly graphical format upon the screen of a person computer.

A control algorithm adjusts the amplitude adjuster, phase adjuster and group delay adjuster of the loop being aligned, as required. The goal is to approach a $(S21)^e$ magnitude of 0 and a $(S21)^e$ phase of 180 degrees across the full bandwidth of the main amplifier 17 using minimax or root mean square criteria.

The amplitude adjuster, phase adjuster, and group delay adjuster of the loop being adjusted are preferably readjusted, so as to obtain maximum loop effectiveness across the frequency range, i.e., minimal $|(S21)^C|$.

The above described aspects of the test and alignment procedure can be automated via the use of a controller, such as an automated test equipment controller or a personal computer. Such automation includes operation of the vector network analyzer 50 in a manner which controls the outputs thereof and which analyzes the monitored inputs thereto. Such automation also preferably includes controlling the selection of the point (P2 or P3) upon the radio frequency power amplifier at which the vector network analyzer monitors a signal therefrom.

According to the preferred embodiment of the present invention, the controller also makes any desired adjustments to the radio frequency power amplifier under test. That is, the controller preferably interfaces with the radio frequency power amplifier and the radio frequency power amplifier is preferably configured such that the phase and amplitude of the signals through the upper leg 13 of the signal cancellation loop 11 and the lower leg 31 of the error cancellation loop 12 are electronically adjustable via such interface.

The controller also preferably effects control of the active path attenuation and control of the operating voltages to the active components of the active paths, so as to facilitate complex gain measurement of the passive paths. The switch 51 is preferably controlled by the controller.

Preferably, the signal cancellation loop 11 and the error cancellation loop 12 are pre-aligned during module testing, which is prior to integration into the final assemblies shown in FIGS. 4–6. Such pre-alignment results in reduced alignment time for the procedures described herein and also tends to enhance desired loop cancellations.

Thus, according to the present invention excessive signal losses due to the use of break points are avoided. The connectors and cables associated with break points are no longer required, such that cost reductions are achieved and such that reliability is enhanced. Power amplifier tuning is simplified by eliminating the need to break and reconnect the break points. Full automation of loop alignment is facilitated.

It is understood that the exemplary radio frequency power amplifier and method for alignment thereof described herein and shown in the drawings represents only presently preferred embodiments of the invention. Indeed, various modifications and additions may be made to such embodiments without departing from the spirit and scope of the invention.

For example, those skilled in the art will appreciate that devices other than a vector network analyzer may be used to provide a test and alignment signal (preferably a swept frequency signal) and to monitor the returned signal.

Further, controllers other than off the shelf automated test equipment controllers and personal computers may be utilized. For example, a dedicated controller may be configured specifically for testing according to the above described procedure.

Thus, these and other modifications and additions may be obvious to those skilled in the art and may be implemented to adapt the present invention for use in a variety of different applications.

Many alterations and modifications may be made by those having ordinary skill in the art without departing from the spirit and scope of the invention. Therefore, it must be understood that the illustrated embodiments have been set forth only for the purposes of example and that they should not be taken as limiting the invention as defined by the following claims. For example, notwithstanding the fact that the elements of a claim are set forth below in a certain combination, it must be expressly understood that the invention includes other combinations of fewer, more or different elements, which are disclosed herein even when not initially claimed in such combinations.

The words used in this specification to describe the invention and its various embodiments are to be understood not only in the sense of their commonly defined meanings, but to include by special definition in this specification structure, material or acts beyond the scope of the commonly defined meanings. Thus if an element can be understood in the context of this specification as including more than one meaning, then its use in a claim must be understood as being generic to all possible meanings supported by the specification and by the word itself.

The definitions of the words or elements of the following claims are, therefore, defined in this specification to include not only the combination of elements which are literally set forth, but all equivalent structure, material or acts for performing substantially the same function in substantially the same way to obtain substantially the same result. In this sense it is therefore contemplated that an equivalent substitution of two or more elements may be made for any one of the elements in the claims below or that a single element may be substituted for two or more elements in a claim. Although elements may be described above as acting in certain combinations and even initially claimed as such, it is to be expressly understood that one or more elements from a claimed combination can in some cases be excised from the combination and that the claimed combination may be directed to a subcombination or variation of a subcombination.

Insubstantial changes from the claimed subject matter as viewed by a person with ordinary skill in the art, now known or later devised, are expressly contemplated as being equivalently within the scope of the claims. Therefore, obvious substitutions now or later known to one with ordinary skill in the art are defined to be within the scope of the defined elements.

The claims are thus to be understood to include what is specifically illustrated and described above, what is conceptionally equivalent, what can be obviously substituted and also what essentially incorporates the essential idea of the invention.

Thus, the detailed description set forth below in connection with the appended drawings is intended as a description of the presently preferred embodiments of the invention and is not intended to represent the only forms in which the present invention may be constructed or utilized. The description sets forth the functions and the sequence of steps for constructing and operating the invention in connection with the illustrated embodiments. It is to be understood, however, that the same or equivalent functions may be accomplished by different embodiments that are also intended to be encompassed within the spirit of the invention.

While the apparatus and method has or will be described for the sake of grammatical fluidity with functional explanations, it is to be expressly understood that the claims, unless expressly formulated using "means for" language as mandated under 35 USC 112, are not to be construed as necessarily limited in any way by the construction of "means" or "steps" limitations, but are to be accorded the full scope of the meaning and equivalents of the definition provided by the claims under the judicial doctrine of equivalents, and in the case where the claims are expressly formulated under 35 USC 112 are to be accorded full statutory equivalents under 35 USC 112.

The invention claimed is:

1. A method for automatically aligning a feed forward loop in a radio frequency power amplifier, the method comprising:
    applying a radio frequency signal to an input of the radio frequency power amplifier;
    splitting the radio frequency signal;
    communicating the radio frequency signal through both legs of one loop of the radio frequency power amplifier;
    combining radio frequency signals from both legs of the loop;
    monitoring the combined radio frequency signal from a selected point of the radio frequency power amplifier; and
    facilitating communication of a radio frequency signal from a signal cancellation loop delay to an error cancellation loop group delay adjuster to facilitate alignment of the signal cancellation loop of the radio frequency power amplifier, wherein said facilitating comprises closing a switch so as to facilitate communication of a radio frequency signal from a signal cancellation loop delay to an error cancellation loop group delay adjuster to facilitate alignment of the signal cancellation loop of the radio frequency power amplifier;
    wherein the selected point of the radio frequency power amplifier provides a signal representative of an output of the error cancellation loop group delay adjuster.

2. The method as recited in claim 1, wherein no breakpoints are open in the radio frequency power amplifier when the radio frequency signal is communicated through both legs of the loop.

3. The method as recited in claim 2, further comprising: terminating an output of the radio frequency power amplifier.

4. A method for automatically aligning a feed forward loop in a radio frequency power amplifier, the method comprising:
    applying a radio frequency signal to an input of the radio frequency power amplifier;
    splitting the radio frequency signal;
    communicating the radio frequency signal through both legs of one loop of the radio frequency power amplifier;
    combining radio frequency signals from both legs of the loop;
    monitoring the combined radio frequency signal from a selected point of the radio frequency power amplifier; and
    inhibiting communication of a radio frequency signal from a signal cancellation loop delay to an error cancellation loop group delay adjuster to facilitate alignment of the error cancellation loop of the radio frequency power amplifier, wherein said inhibiting comprises opening a switch so as to inhibit communication of a radio frequency signal from a signal cancellation loop delay to an error cancellation loop group delay adjuster to facilitate alignment of the error cancellation loop of the radio frequency power amplifier;
    wherein the selected point is an output of the radio frequency power amplifier.

5. A method for automatically aligning a feed forward loop in a radio frequency power amplifier, the method comprising:
    applying a radio frequency signal to an input of the radio frequency power amplifier;
    splitting the radio frequency signal;
    communicating the radio frequency signal through both legs of one loop of the radio frequency power amplifier;
    combining radio frequency signals from both legs of the loop;
    monitoring the combined radio frequency signal from a selected point of the radio frequency power amplifier; and
    controlling a state of a switch via a controller, the switch facilitating/inhibiting communication of a radio frequency signal from a signal cancellation loop delay to an error cancellation loop group delay adjuster.

6. A method for automatically aligning a feed forward loop in a radio frequency power amplifier, the method comprising:
    applying a radio frequency signal to an input of the radio frequency power amplifier;
    splitting the radio frequency signal;
    communicating the radio frequency signal through both legs of one loop of the radio frequency power amplifier;
    combining radio frequency signals from both legs of the loop;
    monitoring the combined radio frequency signal from a selected point of the radio frequency power amplifier;
    measuring a first complex gain along a passive path of a selected loop with the gain of an active path minimized;
    measuring a second complex gain along a composite path of the selected loop;
    determining a relative complex gain from the first and second complex gains; and
    adjusting alignment of the selected loop based upon the relative complex gain.

7. A method for automatically aligning a feed forward loop in a radio frequency power amplifier, the method comprising:
    applying a radio frequency signal to an input of the radio frequency power amplifier;
    splitting the radio frequency signal;
    communicating the radio frequency signal through both legs of one loop of the radio frequency power amplifier;
    combining radio frequency signals from both legs of the loop;

monitoring the combined radio frequency signal from a selected point of the radio frequency power amplifier;

measuring complex gain $(S21)^p$ along a passive path of a selected loop with the gain of an active path minimized;

measuring complex gain $(S21)^c$ along a composite path of the selected loop;

determining a relative complex gain $(S21)^e$ according to the formula $(S21)^e = 1 - (S21)^c/(S21)^p$; and adjusting an alignment of the selected loop so as to make relative complex gain $(S21)^e$ magnitude approximately equal to 0 while also making relative complex gain $(S21)^e$ phase approximately equal to 180°.

8. A method for automatically aligning a feed forward loop in a radio frequency power amplifier, the method comprising:

applying a radio frequency signal to an input of the radio frequency power amplifier;

splitting the radio frequency signal;

communicating the radio frequency signal through both legs of one loop of the radio frequency power amplifier;

combining radio frequency signals from both legs of the loop;

monitoring the combined radio frequency signal from a selected point of the radio frequency power amplifier;

measuring complex gain $(S21)^p$ along a passive path of a selected loop with the gain of an active path minimized;

measuring complex gain $(S21)^c$ along a composite path of the selected loop;

determining a relative complex gain $(S21)^e$ according to the formula $(S21)^e = 1 - (S21)^c/(S21)^p$;

adjusting an alignment of the selected loop so as to make relative complex gain $(S21)^e$ magnitude approximately equal to 0 while also making relative complex gain $(S21)^e$ phase approximately equal to 180°; and readjusting an alignment of the selected loop so as to approximately minimize. $|(S21)^c|$.

9. A system for automatically aligning a feed forward loop in a radio frequency power amplifier, the system comprising:

a radio frequency source configured to provide a radio frequency signal to the radio frequency power amplifier;

a radio frequency monitor configured to monitor a radio frequency signal from the radio frequency power amplifier;

a switch for determining what point on the radio frequency power amplifier the radio frequency monitor is in communication with; and a controller configured to control an output of the radio frequency source and to control a position of the switch;

wherein the radio frequency source and the radio frequency monitor at least partially define a network analyzer.

10. The system as recited in claim 9, wherein the controller comprises an automatic test equipment controller.

11. The system as recited in claim 9, wherein the controller comprises a personal computer.

12. A system for automatically aligning a feed forward loop in a radio frequency power amplifier, the system comprising:

a radio frequency source configured to provide a radio frequency signal to the radio frequency power amplifier;

a radio frequency monitor configured to monitor a radio frequency signal from the radio frequency power amplifier;

a switch for determining what point on the radio frequency power amplifier the radio frequency monitor is in communication with; a controller configured to control an output of the radio frequency source and to control a position of the switch; and a terminator configured to be placed in electrical communication with an output of the radio frequency power amplifier.

* * * * *